United States Patent [19]

Biggs

[11] Patent Number: 4,597,520
[45] Date of Patent: Jul. 1, 1986

[54] BONDING METHOD AND MEANS

[76] Inventor: Kenneth L. Biggs, 3047 N. Valley View, Orange, Calif. 92667

[21] Appl. No.: 647,820

[22] Filed: Sep. 6, 1984

[51] Int. Cl.$^4$ .............................................. B23K 20/10
[52] U.S. Cl. ...................................... 228/111; 228/4.5; 228/1.1; 228/110
[58] Field of Search ................. 228/4.5, 110, 111, 1.1, 228/13, 160

[56] References Cited

U.S. PATENT DOCUMENTS

| | | | |
|---|---|---|---|
| 3,328,875 | 7/1967 | Pennings | 228/111 |
| 3,460,238 | 8/1969 | Christy et al. | 228/111 |
| 3,461,538 | 8/1969 | Worcester et al. | 228/4.5 X |
| 3,623,649 | 11/1971 | Keisling | 228/110 |
| 3,627,192 | 12/1971 | Killingsworth | 228/4.5 |
| 3,689,983 | 9/1972 | Eltzroth et al. | 228/4.5 |
| 3,747,198 | 7/1973 | Benson et al. | 228/111 |

FOREIGN PATENT DOCUMENTS 25822  7/1974  Japan ..................... 228/1.1

Primary Examiner—Nicholas P. Godici
Assistant Examiner—M. Jordan
Attorney, Agent, or Firm—Grover A. Frater

[57] ABSTRACT

A sonic, lead wire bonding tool has both bonding elements and wire cutting elements formed on its working face and a bail which limits lateral movement of the bonding wire and aids in forming the lead wire as it is payed out between between bonds. The bonding tool applies sonic energy to complete the wire bonds and to sever the wire with the aid of wire pulling force after completion of bonding.

19 Claims, 6 Drawing Figures

BONDING METHOD AND MEANS

TECHNICAL FIELD

This invention relates to methods and apparatus for interconnecting electrical circuit points with lead wires and it relates in particular to methods and apparatus and tools for making such interconnections in the circumstance in which the bonding is accomplished ultrasonically using relatively heavy wires.

BACKGROUND ART

The art of interconnecting circuit points on electronic components and integrated circuit devices with one another using lead wires bonded to those points is called "wire bonding". In the current state of the art the actual bonding is often done using sonic energy applied to one side of the wire while at its opposite side the wire rests on the circuit point or "pad" to which it is to be bonded. It is common to bond aluminum and gold wires in the order of one mil diameter to circuit pads only three or four mils square. In the bonding process, wire stored on a spool has its free end bonded to one circuit point. The bonding tool and the work are moved relatively until the second circuit point and the wire lie under the tool. The tool creates a second bond to complete a wire connection between the first and second circuit points. In the usual case the process is completed by breaking the wire adjacent to the second bond.

One popular expedient is to bend the wire adjacent to the second bond to work harden it at that point. Some embrittlement occurs and that minimizes stretching of the wire and makes it easier to break by pulling. The bonding tool rests on the wire at the second bond while the wire is being pulled to reduce strain on the bond. That method works well only for very fine wires up to about ten mils diameter. Gold is too expensive for use in most applications which require heavier wire. Instead, aluminum is used almost exclusively and the design of bonding tools and techniques is based on the characteristics of that material.

The force required to form bends in heavier wires that are made sharply enough to accomplish work hardening and embrittlement is relatively great. So is the force required to part the wire by pulling. These forces exceed the force with which the bonding tool may be brought to bear on the second bond without altering the tool's primary, bonding function. The obvious alternative is to employ some means to cut the wire but to do that is not without problems. The amount of energy required to accomplish bonding exceeds the energy needed to cut a wire. That and other considerations make it impractical to attempt to make the second bond and to cut the wire in a single operation with the bonding tool. One arrangement which has enjoyed considerable success is to mount a guillotine cutter immediately forward of the bonding tool opposite the wire feed side. Additional operating and control mechanism is required and setup is made more complex but the guillotine is an adequate solution in long run, automatic manufacture. The guillotine is not at all satisfactory when manual search and bond procedures are used because it tends to obstruct the operator's view of the work area and it is to the provision of apparatus and techniques for completing heavy wire circuit connection using manual control of the bonding tool that this invention is addressed.

DISCLOSURE OF INVENTION

It is an object of the invention to provide improved methods and apparatus for accomplishing wire bonding using heavier wires.

Another object is to provide a heavy wire bonding method which is easy for an operator to practice, which permits high quality manual work and which tends to minimize operator fatigue.

A related object is to combine bonding and cutting implements in a single sonically activated tool in a way that does not limit visibility and provides reasonable procedural freedom without loss of control over wire position for making successive bonds.

It is a further object to provide a method and tools for its practice which in terms of cost, reliability, and ease of operation are suitable for use in emerging countries where technical support facilities and skill levels are not yet fully developed.

In the invention the bonding tool by which sonic energy is applied to the work is arranged to do two different tasks both of which utilize sonic energy. The tool accomplishes both bonding of wires and severing of wires. In the preferred method severing is initiated using sonic energy and is completed by pulling. The working face of the bonding tool is configured to include elements that hold and impart sonic energy to the wire to be bonded and to include a cutter or chisel. These elements are arranged for selective use. In the preferred form there are two chisels on the tool face, one on either side of the elements that hold and bond the wire. After the second bond in an interconnection sequence is completed, the tool is shifted to one side such that the cutter or chisel overlies the wire at the point at which it is to be cut. Simultaneous downward pressure and the application of sonic energy to the tool partially cuts the wire. Thus severed, the wire is then parted by pulling before tool pressure is released.

In preferred form the tool face includes two chisels to permit left or right translation selectively. That means the operator's left or right because in the usual bonding machine configuration the wire is directed at the bonding points along a line pointing toward the operator. While not essential, in the preferred form the chisels are located at the forward edge of the tool so that the second bond is clearly visible and the operator can insure that that the cut is made clear of the bond. Having the chisel at the forward edge provides the advantage that the standing part, the end of the wire on the supply side, still underlies the tool after the cut is made and the wire is severed by pulling. However, that advantage is negated in part by the fact that the standing part of the wire has been moved from its position under the bonding elements of the tool face and is long relative to the working face of the tool. Those factors serve to complicate repositioning the wire to permit making the first bond in the succeeding interconnection process. The bonding machine includes a tweezer-like clamping mechanism which is operable to grasp and release the length of lead wire between the supply spool and the bonding tool. The clamp may be driven toward the tool to feed the lead wire or driven away from the tool to pull and break the lead wire. In the invention the clamp or some separate structure may be used to reposition the wire laterally to return it to bonding position. Also, the invention includes another feature which, while not required in every application, contributes greatly in minimizing the task of lateral positioning while preserving the ability to use the bonding tool to loop the connecting wire upward in the space between the first and second bonds whereby to avoid short circuiting with other circuit elements. This form of the tool of the invention includes a bail at the side of the tool opposite the forward edge. The lead wire is threaded through the bail in the direction from the clamp toward the working face of the tool. Unlike the guide hole often used in bonding tools, the bail opening does not direct the wire to the bond site under the bonding elements of the tool face. Instead it limits the lateral displacement of the standing part of the wire to a position under the bonding elements or the chisel or chisels. In a proper case the sides of the bail may be used as a stop to force bending and consequent lateral positioning of the standing part of the wire when the wire is moved laterally by the clamp and tool assembly.

These and other features and advantages of the invention will become apparent upon an examination of the accompanying drawing and a reading of the following specification of the currently preferred form of the invention.

DESCRIPTION OF THE PREFERRED EMBODIMENT

While the invention is useful in a variety of applications in which the relative importance of its several novel features may differ, one of its most important uses is in decreasing capitol investment and production cost in the manufacture of a variety of electronic products in relatively small volume. It is common to produce basic functional circuitry in large quantities as integrated circuit chips containing one or more of the circuits in a single unit of standard size many times greater than the chip. In one example the final unit is a package almost twenty times the volume of the chip and which includes fourteen connector pins connected to six independent functional circuits of the same kind formed on the chip. General purpose units of that kind are still incorporated in special purpose circuitry, which most often includes discrete circuit components. They are soldered into circuit boards or have their pins inserted in sockets on the boards where interconnection is accomplished using foil circuit runs. However, there is a growing tendency, in response to demand for smaller size and higher frequency capability and reasonable cost, to omit the standard unit package and multiplication of circuits and to wire bond directly from the chip to terminals of descrete circuit elements. That kind of design often combines heavy wire bonding in power circuits and fine wire bonding in high density circuitry on the same board or base. It is very advantageous in that circumstance to be able to do both types of bonding with the same bonding machine even if different bonding tools are required to bond the two wire sizes. That is especially true when facilities and skill needed to setup and maintain the machines is minimal.

Figure 1:
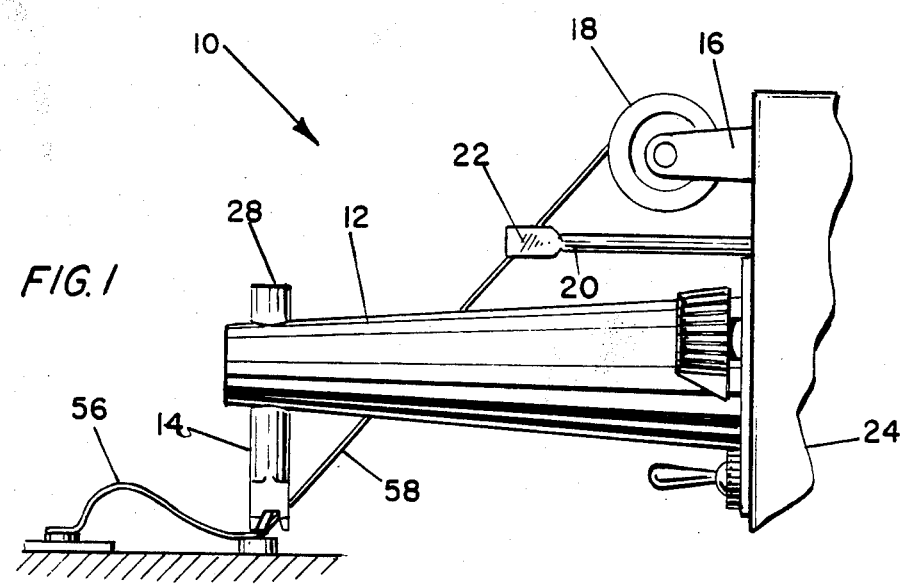
FIG. 1 is a schematic showing of sonic wire bonding apparatus including a bonding tool and related apparatus according to the invention by which the method of the invention may be practiced.

The bonding machine 10 of FIG. 1 is capable of accomplishing both fine wire and heavy wire circuit interconnection with no more than a change of bonding tools, resetting of an action program with the flip of switch and replacing one wire spool with another. The machine is one of a number of commercially available wire bonding units a representative one of which is shown in U.S. Pat. No. 3,659,770. The machine 10 includes a conventional sonic energy transducer whose coupler 12 is capable of holding and sonically driving a conventional, fine wire bonding tool or the special tool 14 in which the invention is embodied. The machine includes a wire spool holder 16 on which a spool 18 is mounted. A heavy wire, between ten and twenty mils in diameter, extends from the spool through a passage in the coupler between the two blades of a tweezer clamp 20 to the rearward side of the tool 14.

Like the transducer, spool and spool holder, the clamp is standard. Its blades, of which blade 22 is one, open and close on the wire to release and to clamp it, respectively. In addition the clamp is movable in the direction along the wire toward the tool to feed the wire and in the opposite direction to pull the wire away from the tool and it is movable laterally with the coupler and tool. The standard bonding machine includes a means for moving the tool and the work relative to one another, for applying bursts of sonic energy to the tool through the coupler at selected and preprogrammed times for selectable and programmable times and for operating the clamp as described above in coordination with sonic energy application. The machine 10 includes a corresponding means 24.

Figure 6:
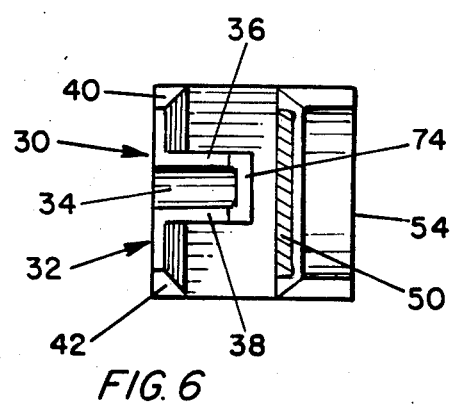
FIG. 6 is a bottom plan view of the tool.

The preferred form of bonding tool for use in the invention is the tool 14 of FIG. 1. It is shown in detail in FIGS. 2 through 6. The shank 28 is round in this model except at the point where it is gripped by a set screw to the coupler, and the lower portion is square in transverse cross-section. The lower face of the tool is its working face. It lies in a plane perpendicular to the line of movement toward and away from the work on which it is to act. Most of the working face is cut away so that in this case only two "L-shaped" surfaces, 30 and 32, remain. They are separated by a wire retaining groove 34. The arms of the L-shaped surfaces that form the sides of the groove are numbered 36 and 38, respectively, in the bottom view, FIG. 6. The other arm of the surface 30 is numbered 40 and the other arm of surface 32 is numbered 42. Those two arms 40 and 42 are the cutting ends of two chisels identified in others of the figures as chisels 44 and 46, respectively, and they are located at what is the forward edge of the tool's working face. The rearward edge of the working face is at the rearward end of the groove 34.

Figure 2:
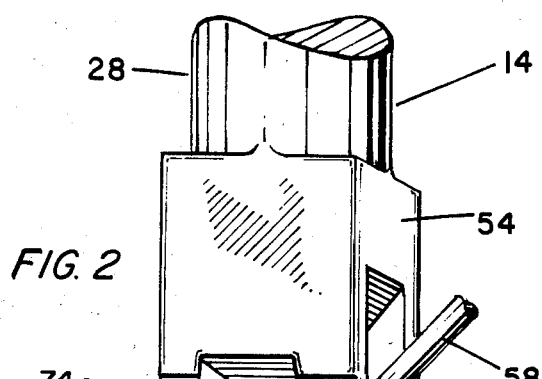
FIG. 2 is an isometric view of one end of the tool shown in FIG. 1.
Figure 3:
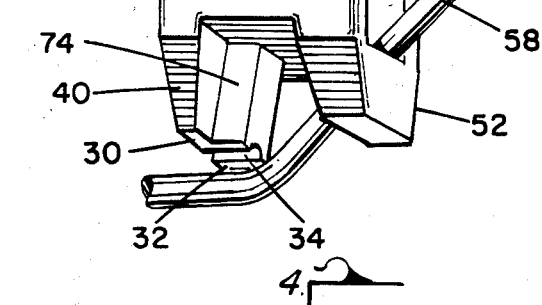
FIG. 3 is a view in rear elevation of the lower end of said tool.
Figure 4:
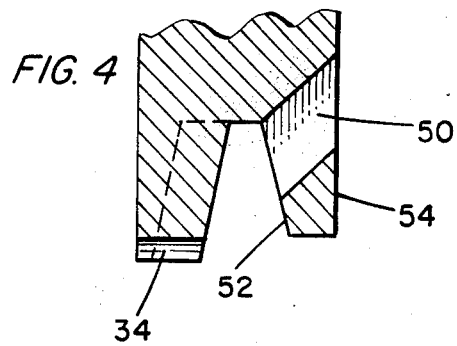
FIG. 4 is a cross-sectional view of the tool's lower end taken on line 4—4 of FIG. 3.
Figure 5:
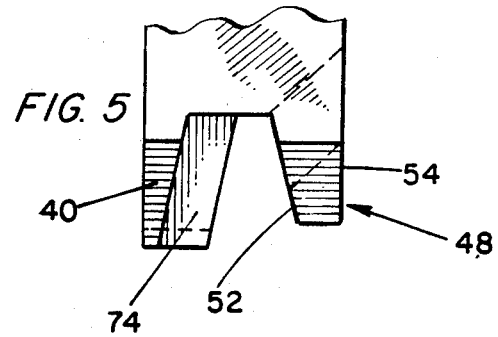
FIG. 5 is a view in side elevation of the lower portion of the tool.

The face of the tool is cut away across its width such that the lower end is divided into the combination of the working face at the forward side, and a wedge shaped portion 48 at the rearward side. The latter is shorter than the conformations that define the groove and chisels and it is formed with a large through opening 50. The opening extends from the inner face 52 of the wedge upwardly and rearwardly to the rear side 54 of the tool's lower end. The opening 50 is so large relative to the wedge through which it is formed that what remains of the wedge serves only as a bail. The lead wire 58 is threaded through the bail opening 50 as shown in FIG. 2 when the tool is in use. It serves the same wire shaping function as does the guide hole in a conventional fine wire bonding tool. However, unlike the conventional guide hole, the bail opening is too wide to guide the wire to the retaining groove. It is sufficiently wide to permit lateral movement of the tool to a position such that the wire is under the retaining groove under either one of the chisels when, as here, there are two. But in preferred form the bail opening is no wider than is required to permit such relative movement. In this case it must be at least three times as wide as the the wire retaining groove 34 but not so wide as to extend beyond the width of the chisels. That limitation establishes a reference for movement of the tool to position under one of the chisels over the wire, as shown in FIG. 3, or to move the tool over so that the conformation that defines the retaining groove is positioned over the wire as shown in FIG. 2.

The method of the invention can be understood by comparison with the method used to make fine wire interconnections. One conventional fine wire tool for use with machine 10 and others like it has a wire retaining groove in its working face in which the wire is held as bonds are formed. A wire guide hole extends from a point on the rear side of the tool downwardly to the rearward end of the groove. The guide hole is large enough to offer no appreciable resistance to passage of the wire and small enough to maintain the wire in alignment with the wire retaining groove at the working face. A second function of the guide hole is to permit shaping the lead wire between the circuit points to which it is bonded so that it loops upwardly where it cannot form a short circuit with components and conductors disposed between the bonding points. The process is easily envisioned. At completion of one interconnection the end of the standing part of the lead wire supply, having been parted by pulling from the previously bonded section of wire, extends through the guide hole to a point just rearwardly of the tool's wire retaining groove. The clamp 20 grasps the wire and, moving in the direction of the wire, feeds a length of wire downwardly below the tool face far enough so that, when pressed down against the first circuit point of the next pair to be interconnected, The end of the wire extends a very short distance beyond the forward edge of the tool.

The wire, thus positioned on the first circuit point and pressed by the sonic bonding tool in whose retaining groove it is held, is subjected to a burst of sonic energy enough to bond the wire to the circuit point. The tool is then lifted up form the first bond site. The lead wire is reeved through the guide hole as the tool is raised but it is bent upwardly to follow upward movement of the tool. Work hardening at the bend tends to make the wire retain that upward shape as the tool is stepped back to a position over the second bond point. There the tool is lowered. Because of the guide hole, the lead wire will be disposed directly under the retaining groove of the tool face. All that is required is to lower the tool, press the wire against the second bond point and apply the sonic energy. Then, while the tool is resting on the second bond, the clamp 20 is used to pull the wire until it has parted.

The upward loop 56 in the lead wire 58 of FIG. 1 illustrates the shape of a typical interconnecting fine wire bond produced by that method. FIG. 1 illustrates that similarly shaped interconnections can be made using heavy wire. The method of the invention is practiced with a tool that carries a cutting or chisel edge which is placed on the wire in back of the second bond after the bond is formed. Sonic energy applied through the tool is combined with pulling on the wire to part it. That step requires translation of the tool relative to the wire such that the wire and the retaining groove of the tool face are misaligned. Once the wire is parted the second bond point is not available as a reference for realignment of the wire. In the invention the wire is moved transversely relative to the tool or, conversely, the tool is moved transversely relative to the wire. The process of completing a wire connection between two points begins with the step of aligning the wire end with the bond forming groove or other bond forming conformation on the bonding tool. A means for accomplishing that is provided in the structure 24 that permits movement of the tool and clamp relative to the work.

The wire having been positioned in alignment with the retaining groove, the tool and wire are positioned together over the first circuit point. The tool is lowered, sonic energy is applied and the bond is completed. Next the tool is raised. The wire is reeved through the bail opening and is bent upwardly much as if it was threaded through the guide hole of a conventional tool. The tool is stepped toward the second bond point and beyond and then returned to the second bond point to form the loop. Throughout that step the wire is held in alignment with the tool's retaining groove. The tool and wire are lowered, a burst of sonic energy is applied to the tool and the second bond is completed at the second bond site. The next step is to move the tool, or the work, so that the cutter or chisel overlies the wire at a point removed from the second bond on the side away from the first bond which is at the side of the standing part of the wire. The tool is lowered to the wire with one chisel or the other resting on the wire. Sonic energy is applied to the tool and the chisel begins severing the wire. It is preferred not to cut the wire entirely through lest the circuit pad or the tool be damaged. To insure against parting the wire with sonic energy or straining the second bond, the sonic burst applied to the chisel for a shorter time is less intense than the bursts applied to accomplish bonding. It is preferred to control deformation by reducing the duration of the severing pulse. The wire is pulled after the sonic energy is being applied. It is pulled by the clamp with a force less than enough to break the wire in the absence of the sonic cutting. It is the combination of pulling and cutting that breaks the wire and that feature tends to insure against stretching the wire before breaking, thus to provide a precise wire length for the next cycle.

It will be apparent that the method can be practiced with a tool that has only one cutter or chisel. It is not essential that the cutter be positioned as far forward as the front edge of the tool but the inclusion of the cutters and far forward positioning of the cutters is much preferred. In any event the cutter must be positioned so the operator can know that the wire will be cut behind the second bond.

Viewed from the side the tool's lower end has the shape of a inverted "U" whose arms are formed by the chisel at the front and the bail at the rear. The space between those the chisels and the bail is partially occupied at the chisel side by a rib 74 which is about one third as wide as the tool and is centered across the width of the tool. The bonding or wire retaining groove 34 is formed at the bottom of the rib. That rib cooperates with the sides of the bail 52 to guide the lead wire under the cutters when the wire is to be severed.

I claim:

1. Apparatus for accomplishing bonding and severing of conductor wires at a work position, comprising:
    a tool;
    means for moving one end of the tool in the direction toward and away from said work position;
    said one end of the tool comprising a work face extending substantially perpendicular to said direction from a forward edge to a rearward edge;
    the work face being formed with a wire retaining groove extending across said face in a direction from said forward edge to said rearward edge;
    said work face further being formed with conformations defining at least one chisel extending, at an associated side of said groove, in the direction normal to said groove; and
    said tool further comprising means in the form of a wire retaining bail positioned opposite and spaced from said rearward edge of said work face for confining lateral movement of any wire extending through the bail toward said work face.

2. The invention defined in claim 1 in which said chisel is formed proximate to said forward edge of said work face.

3. The invention defined in claim 1 in which said conformations define a pair of chisels each extending at a respectively associated side of said groove in the direction normal to said groove.

4. The invention defined in claim 3 in which said chisels are formed proximate to the forward edge of said work face.

5. The invention defined in claim 4 in which said bail is formed with a bail opening whose width, in the direction parallel to said chisels, is is not less than three times the width of said wire retaining groove.

6. The invention defined in claim 5 which further comprises means for moving the tool, laterally in the direction in which said groove is formed, a distance from a first position not less than the length of the groove and laterally, in the direction in which one of said chisels extends, a distance not less than the width of said groove to a second position; and
    means for applying a first burst of sonic energy to said tool when in said first position and a second, lesser burst of sonic energy when in said second position.

7. In a tool of the kind which has a work face and is to be movable both laterally over the surface of a work piece and toward and away from the work piece to carry the work face into contact, and to retract it from contact, with the work piece, the improvement in which the work face is formed with a forward edge and a rearward edge and with a wire retaining groove formed in the work face in the direction from one of said edges to the other and with conformations defining a pair of chisels, one on each side of the groove and extending perpendicular to said groove and projecting from the work face in the direction of movement toward the work piece.

8. The invention defined in claim 7 in which said chisels are formed proximate to the forward edge of said work face.

9. The invention defined in claim 7 in which said tool includes a wire retaining bail positioned with its bail opening opposite and spaced from the rearward edge of said work face.

10. The invention defined in claim 7 in which said tool comprises a rod one end of which is formed with a transverse slot to divide said end of the rod into the work face at one side of the slot and a wire retaining bail portion at the other side of the slot, the bail being formed by an opening in the rod extending through said bail portion from the slot to the side of the rod opposite the working face.

11. The invention defined in claim 10 in which the working face of the rod extends beyond the bail in the direction of the length of the rod.

12. The invention defined in claim 10 in which the axis of said groove of the working face and the axis of the rod are substantially perpendicular to one another and in which the axis of said opening of the bail forms an angle with, and is directed substantially to intersect with, said axis of the groove and said axis of the rod.

13. The invention defined in claim 12 in which the width of the opening of the bail in the direction parallel to said rearward edge of the working face exceeds the width of said groove at each side of said center line by an amount no less than the width of said groove.

14. The method of completing an electrical connection between two circuit points with the aid of a tool having a working face formed in one region of said working face to define wire retaining conformations and formed at forward edge of the working face to define a chisel, which method comprises the steps of:
    completing a first bond between a length of lead wire and the first circuit point by utilizing said wire retaining groove to hold one end of the wire over said first circuit point while applying sonic energy to the wire and first circuit point through the tool;
    thereafter, utilizing the tool to shape the lead wire and form it such that a portion of the wire along its length overlies the second circuit point;
    thereafter, completing a second bond between the lead wire and the second circuit point by utilizing said wire retaining groove to hold said portion of the lead wire on the second circuit point while applying sonic energy to the lead wire and circuit point through the tool; and
    thereafter, moving the tool such that said portion of the wire and the second circuit point do not underlie the tool, and then utilizing said groove to sever the wire adjacent the second bond by engaging the lead wire with said chisel of the tool while applying sonic energy over some interval of time to the chisel through the wire.

15. The invention defined in claim 14 in which the tool includes a bail that defines a lead wire receiving passage leading to said working face at the side opposite said forward edge and in which said lead wire remains threaded through said bail during the steps of completing said bonds and shaping and severing the lead wire.

16. The invention defined in claim 15 which comprises the further step of exerting a pulling force on the lead wire over at least a portion of said interval of time when sonic energy is applied to the chisel.

17. The invention defined in claim 16 in which the amount of sonic energy applied the chisel and the pulling force applied to the wire are each less than the amount required to completely sever and part the lead wire in the absence of the other.

18. The invention defined in claim 14 in which the tool is moved sufficiently following completing of the second bond and before applying sonic energy to said chisel to expose said portion of the lead wire and the second bond to view from above whereby an operator conducting the method can verify that the chisel will not engage the lead wire at said second bond.

19. The invention defined in claim 15 which comprises the further step of exerting a pulling force on the lead wire after at least a portion of said interval of time when sonic energy is applied to the chisel has expired.

* * * * *